US006777881B2

United States Patent
Yuzurihara et al.

(10) Patent No.: US 6,777,881 B2
(45) Date of Patent: Aug. 17, 2004

(54) POWER SUPPLY APPARATUS FOR GENERATING PLASMA

(75) Inventors: Itsuo Yuzurihara, Zamashi (JP); Masahiro Kikuchi, Yokohamashi (JP); Toyoaki Suenaga, Yokohamashi (JP); Yoichi Ishikawa, Yokohamashi (JP)

(73) Assignee: Kyosan Electric Mfg. Co., Ltd., Yokohama (JP)

( * ) Notice: Subject to any disclaimer, the term of this patent is extended or adjusted under 35 U.S.C. 154(b) by 0 days.

(21) Appl. No.: 10/292,580

(22) Filed: Nov. 13, 2002

(65) Prior Publication Data
US 2004/0032212 A1 Feb. 19, 2004

(30) Foreign Application Priority Data
Aug. 9, 2002 (JP) ........................................ 2002-233942

(51) Int. Cl.$^7$ ................................................. H01J 7/24
(52) U.S. Cl. ............................. 315/111.81; 204/298.08; 204/298.34; 333/99 PL
(58) Field of Search ........................ 315/111.81, 111.21, 315/111.41, 111.51; 333/17.1, 17.3, 99 PL, 32; 204/298.08, 298.34

(56) References Cited

U.S. PATENT DOCUMENTS

| 4,629,887 A | * | 12/1986 | Bernier ....................... 250/251 |
| 5,175,472 A | * | 12/1992 | Johnson, et al. ......... 315/111.21 |
| 5,394,061 A | * | 2/1995 | Fujii ...................... 315/111.21 |
| 5,566,060 A | * | 10/1996 | Shimer et al. ................. 363/65 |
| 5,747,935 A | * | 5/1998 | Porter et al. ............ 315/111.51 |
| 5,936,481 A | * | 8/1999 | Fujii ........................... 333/17.3 |
| 6,046,546 A | * | 4/2000 | Porter et al. ............ 315/111.21 |
| 6,703,080 B2 | * | 3/2004 | Reyzelman et al. ......... 427/445 |
| 2002/0104753 A1 | * | 8/2002 | Kloeppel et al. ...... 204/192.12 |
| 2003/0071035 A1 | * | 4/2003 | Brailove, Adam Alexander ............................................................. 219/672 |

* cited by examiner

Primary Examiner—Thuy Vinh Tran
(74) Attorney, Agent, or Firm—Oliff & Berridge, PLC

(57) ABSTRACT

A power supply apparatus for generating a plasma for supplying a high-frequency power to a plasma generating device which is a load. The power supply apparatus comprises: a DC power supply; a power conversion circuit which comprises an amplifier circuit of D-class comprising a plurality of switching elements, and which converts a DC power output of the DC power supply to a high-frequency power to output; and a load impedance conversion circuit which converts a load impedance to a predetermined delayed load, wherein the power supply apparatus is adapted to supply the high-frequency power output from the power conversion circuit to a plasma generating device through the load impedance conversion circuit.

8 Claims, 10 Drawing Sheets

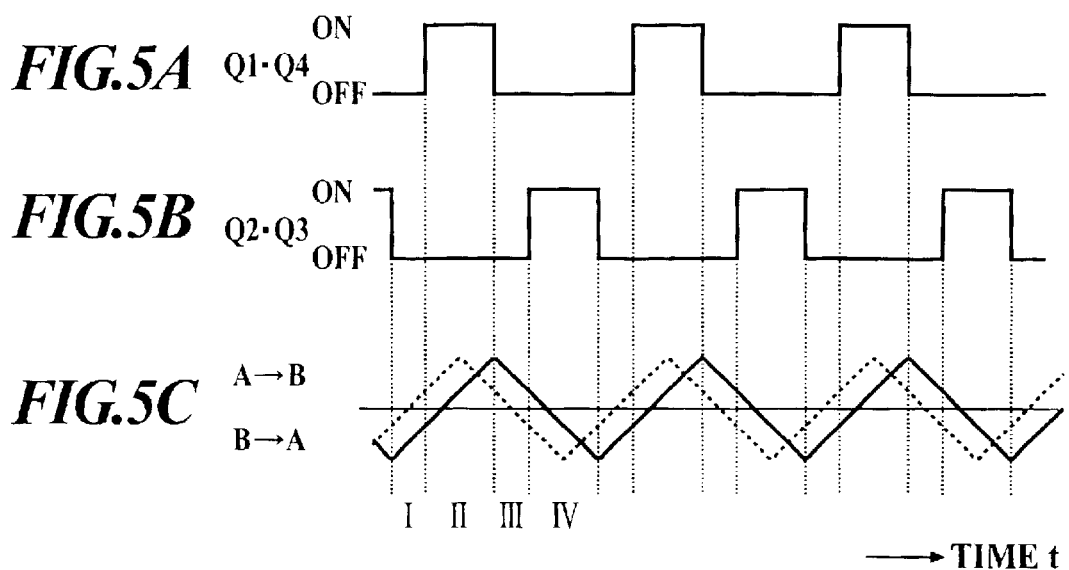
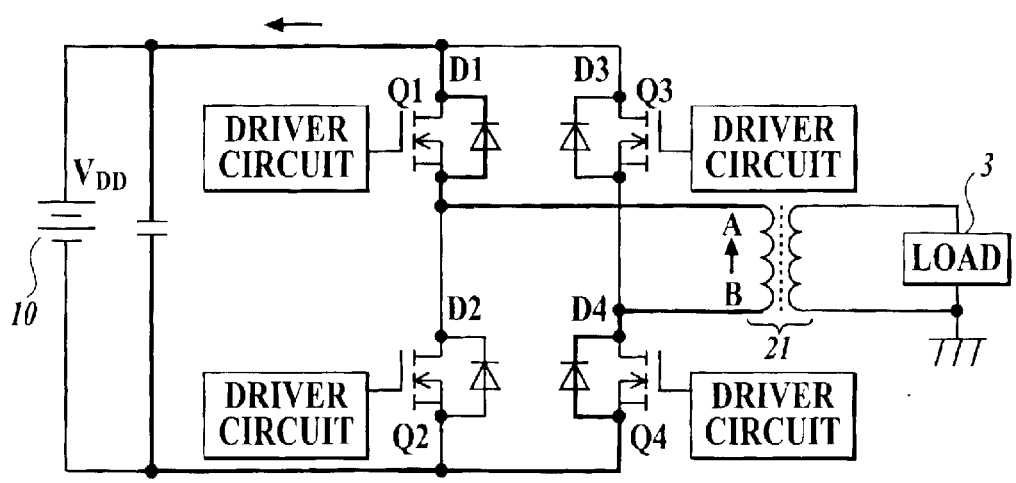

FIG.10A Q1·Q4 ON/OFF
FIG.10B Q2·Q3 ON/OFF
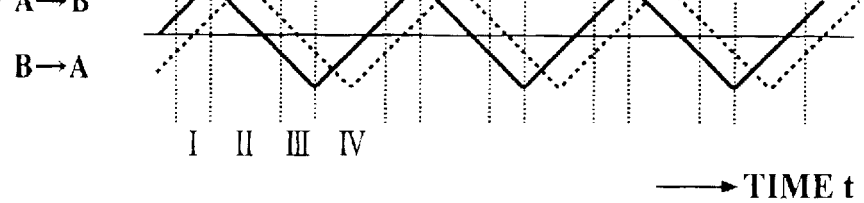
FIG.10C A→B, B→A
TIME t
FIG.11
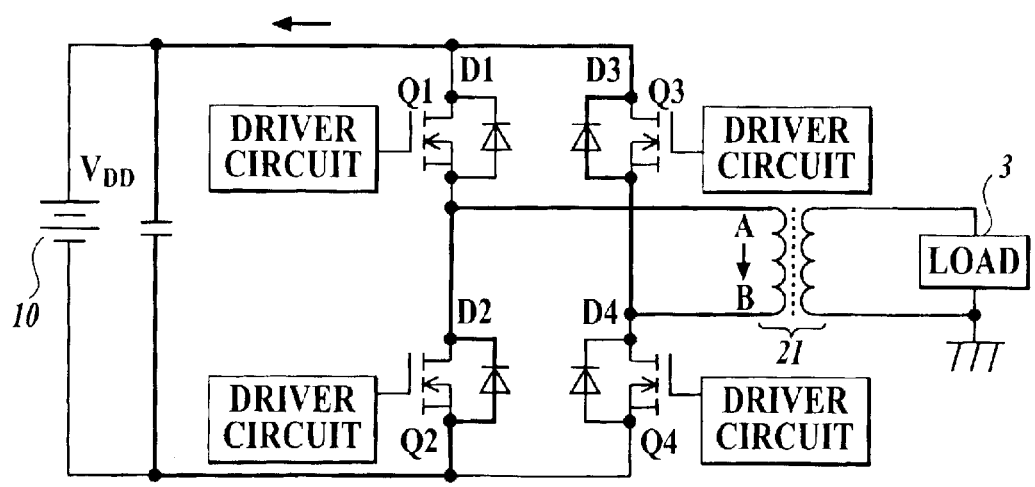

POWER SUPPLY APPARATUS FOR GENERATING PLASMA

BACKGROUND OF THE INVENTION

1. Field of the Invention

The present invention relates to a power supply apparatus for generating a plasma.

2. Description of Related Art

A power supply apparatus for generating a plasma, which may be referred to "a power supply for plasma" simply and suitably, hereinafter, is known as a power supply used for the purpose of generating a stable plasma in a step of semiconductor manufacturing process, e.g., a step of, high-frequency sputtering, plasma CVD, plasma etching, plasma ashing or the like.

A conventional power supply for plasma has an amplification system which comprises a multi-stage linear amplifier, that is, amplifiers connected in a multi-stage, for amplifying minute oscillations generated by a built-in quartz oscillator, up to the final output in order. The amplification system used in the power supply is called as the linear amplification system which has a relatively low efficiency of about 50%.

However, use of such a conventional amplifier with a low amplification efficiency cannot satisfy the requirement of a large output of power supply for plasma by the market because of making the volume and the power loss of the power supply apparatus very large. For the reason, recently, the so-called switching mode amplifier which has an amplification system with an efficiency higher than that of the conventional one, i.e., more than 80%, is mainly used. The switching mode amplifier includes two amplification systems, that is, the so-called Class-D and Class-E. For the power supply for plasma, the amplification system of Class-E is generally used.

FIG. 17 shows a circuit construction of a general amplification system of Class-E. In the system of Class-E, a switching element $Q_S$ and a choke coil $RF_C$ are connected in series with respect to an input voltage $V_{DD}$. A sine wave output is obtained from the connection between the switching element $Q_S$ and the choke coil $RF_C$ through a series resonant circuit which comprises a resonant capacitor $C_O$ and a resonant reactor $L_O$.

In the system of Class-E shown in FIG. 17, the peak value of voltage applied to the switching element $Q_S$ becomes large to exceed three times the voltage $V_{DD}$ of the power supply even in a steady state of the load because the switching element $Q_S$ is connected to the power supply $V_{DD}$ through the choke coil $RF_C$. Further, in a plasma generating apparatus in which there are steep fluctuations in load, the load may change from open circuit to short circuit and vice versa in a short time, in a transient phenomenon, so that an excess voltage may be often applied to the switching element $Q_S$ depending on the change of states. There is a problem that the switching element $Q_S$ may be destroyed in a moment when the voltage applied to the switching element $Q_S$ exceeds the allowable voltage once.

SUMMARY OF THE INVENTION

An object of the invention is to realize a power supply apparatus for generating a plasma which has a high efficiency and can protect the switching element from steep transient fluctuations peculiar to plasma load.

In accordance with an aspect of the invention, the power supply apparatus for generating a plasma for supplying a high-frequency power to a plasma generating device which is a load, comprises:

a DC power supply (for example, a variable DC power 10 in FIG. 1);

a power conversion circuit (for example, amplifier circuits 20 in FIG. 1) which comprises an amplifier circuit of Class-D comprising a plurality of switching elements and which converts a DC power output of the DC power supply to a high-frequency power to output; and a load impedance conversion circuit (for example, a load impedance conversion circuit 30 in FIG. 1) which converts a load impedance to a predetermined delayed load, wherein the power supply apparatus is adapted to supply the high-frequency power output from the power conversion circuit to a plasma generating device through the load impedance conversion circuit.

According to the power supply apparatus of the invention, because the power conversion circuit comprises an amplifier circuit of Class-D comprising a plurality of switching elements and which converts a DC power output of the DC power supply to a high-frequency power to output, it is possible to suppress the voltage applied to each switching element up to the voltage maximum supplied by the DC power supply. Accordingly, even if the power supply apparatus is used for a plasma generating apparatus in which there are steep fluctuations in load in a transient phenomenon, it is possible to prevent destruction of the switching element in the power supply apparatus.

Further, because the load impedance is converted to a predetermined delayed load with respect to the power conversion circuit by the load impedance conversion circuit, the load current is also delayed in phase. As a result, it is possible to reduce loss in the circuit which may be occurred by switching operations and to realize a power supply apparatus for generating a plasma with a high efficiency.

To be concrete, the load current is delayed in phase with respect to the power conversion circuit so that the direction of the load current is changed after an elapse of a predetermined time after the semiconductor switches turn on, for example, a time longer than one corresponding to the recovery time for the parasite diodes of the semiconductor switches. Thereby, it is possible to prevent short-circuit current flowing through the amplifier circuit and therefore to reduce the loss which may be occurred by switching operations.

Preferably, the power conversion circuit comprises a full bridge inverter circuit in which the plurality of switching elements are bridge-connected.

The above-described predetermined delayed load preferably makes a phase of load current delay so that a direction of the load current is reversed after an elapse of a predetermined time since one of the switching elements turns on.

The predetermined time may be longer than a time corresponding to a recovery time for parasite diodes of the one of the switching elements.

The load impedance conversion circuit may comprise a reactance Xs connected to one of input terminals thereof in series and a reactance Xp connected to the input terminals in parallel, each of the reactance Xs and Xp comprising a coil or a capacitor, to determine the phase of load current delayed.

Preferably, the power supply apparatus further comprises: a composition circuit for composing outputs of the plurality of amplifier circuits which are supplied through the load impedance conversion circuit, to generate a high-frequency power with a high voltage; a filter circuit for cutting off harmonic components from an output of the composition circuit; a power sensor for detecting an output power of the filter circuit; and a control circuit for controlling a power conversion operation of the DC power supply on the basis of a detected value of the power sensor.

Preferably, each of the amplifier circuits of Class-D comprises: first, second, third and fourth semiconductor switches which are bridge-connected; and a transformer, a terminal of a primary winding of the transformer being connected to a connecting point of the first and second semiconductor switches and the other terminal of the primary winding being connected to a connecting point of the third and fourth semiconductor switches.

The first, second, third and fourth semiconductor switches have first, second, third and fourth parasite diodes, respectively; and the predetermined delayed load allows the amplifier circuit to transfer from the first and fourth parasite diodes being ON to the first and fourth semiconductor switches being ON, so that no excess current nor excess voltage are generated in the second and third semiconductor switches and in the second and third parasite diodes, and to transfer from the second and third parasite diodes being ON to the second and third semiconductor switches being ON, so that no excess current nor excess voltage are generated in the first and fourth semiconductor switches and in the first and fourth parasite diodes.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIGS. 5A–5C are timing charts showing the operation of the amplifier circuit shown in FIG. 4;

FIG. 6 is a circuit diagram showing an example of current path in an amplifier;

FIGS. 10A–10C are timing charts showing the operation of the amplifier circuit in case of leading load;

FIG. 11 is a circuit diagram showing an example of current path in an amplifier;

DESCRIPTION OF THE PREFERRED EMBODIMENT

An embodiment of the invention will be explained in detail with reference to the drawings.

Figure 1:
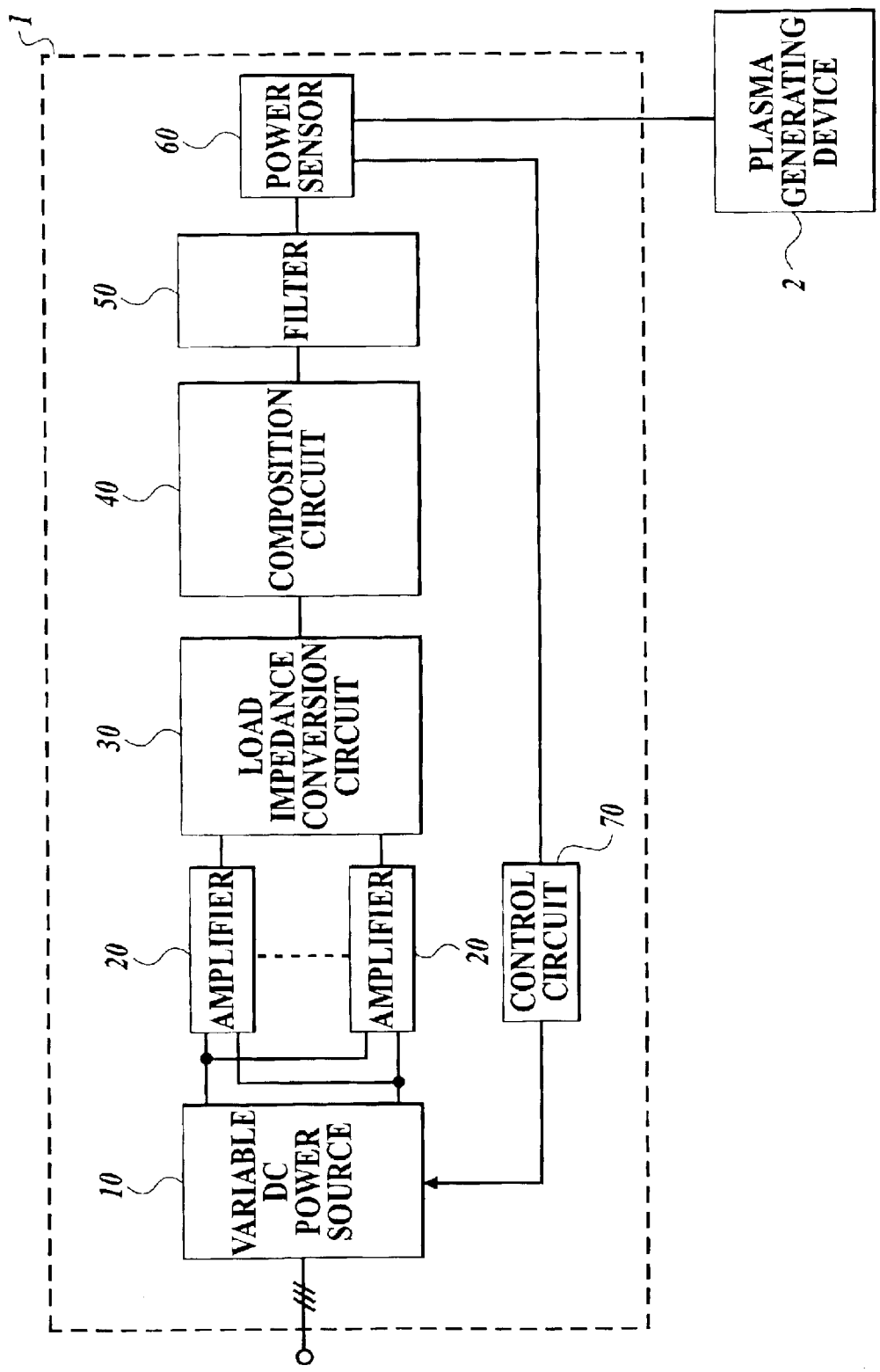
FIG. 1 is a block diagram showing a schematic construction of the power supply apparatus for generating a plasma according to an embodiment of the invention.

FIG. 1 is a block diagram showing a schematic construction of the power supply apparatus 1 for generating a plasma according to an embodiment of the invention. The power supply apparatus 1 for plasma, for example, converts a three-phase alternating current power supplied from the commercial frequency power to a high frequency, e.g., radiofrequency, power with a predetermined voltage, and supplies it to a plasma generating device 2 which is a load. When the apparatus 2 is viewed from the side of the power supply apparatus 1, the plasma generating device 2 with a load of a pure resistance of 50Ω is matched to the power supply apparatus 1 by a matching member (not shown).

The power supply apparatus 1 comprises a variable DC power source unit 10, a plurality of high-frequency, e.g., radiofrequency, amplifier circuits 20 which are simply referred to as "amplifier circuits" hereinafter, a load impedance conversion circuit 30, a composition circuit 40, a filter circuit 50, a power sensor 60, and a control circuit 70.

The variable DC power source unit 10 functions a converter which converts an input AC power to a DC power to output. The operation of the power conversion is controlled by the control circuit 70.

The amplifier circuits 20 are the so-called amplifiers of Class-D each of which includes switching elements Q1 and Q2 connected to one another in series, and Q3 and Q4 connected to one another in series. The amplifier circuits 20 convert the DC power supplied from the variable DC power source unit 10 to a high-frequency power, e.g., radiofrequency power, to output.

Figure 2:
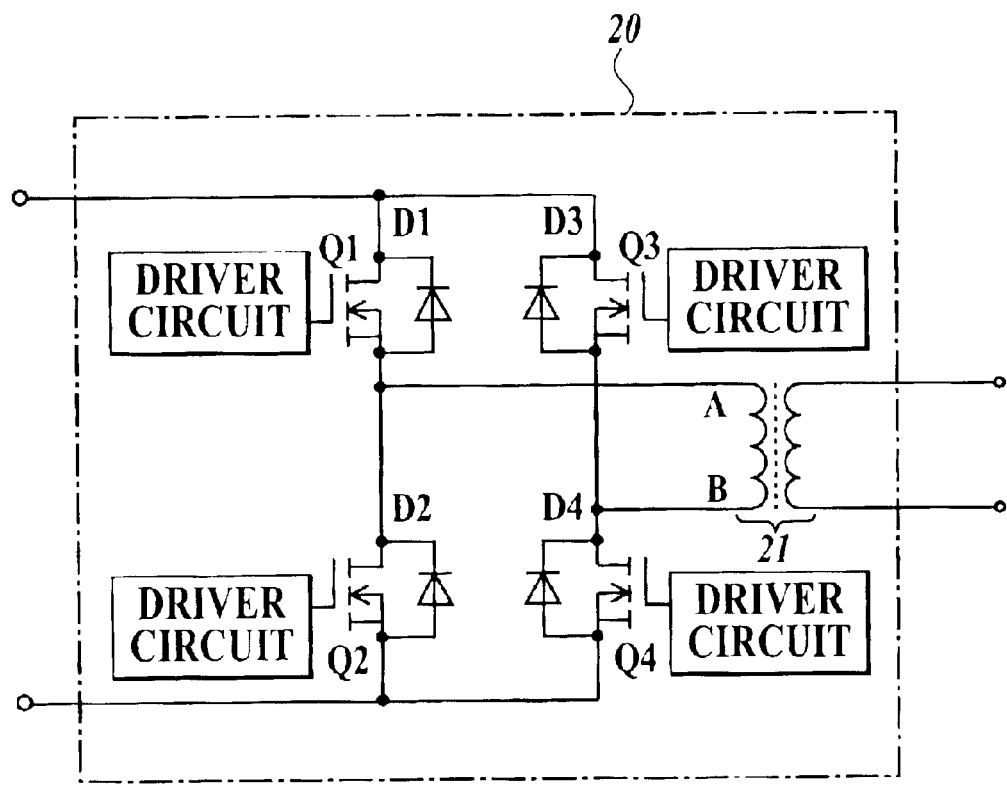
FIG. 2 is a block diagram showing a schematic construction of an embodiment of the amplifier.

The construction of the amplifier circuit 20 is shown in FIG. 2. The amplifier circuit 20 comprises four semiconductor switches Q1, Q2, Q3, and Q4 which are bridge-connected, and a transformer 21.

Each of the four semiconductor switches Q1, Q2, Q3, and Q4 is a MOS-FET. On or off state between the drain and the source of each semiconductor switch Q1, Q2, Q3, or Q4, that is, On or off state of each semiconductor switch, is controlled by a voltage signal, i.e., a gate signal, which is input into each gate from each driver circuit.

The source of the semiconductor switch Q1 is connected with the drain of the semiconductor switch Q2, and the source of the semiconductor switch Q3 is connected with the drain of the semiconductor switch Q4. The drains of the semiconductor switches Q1 and Q3 are connected with each other, the sources of the semiconductor switches Q2 and Q4 are connected with each other.

A terminal of the primary winding which will be described later, of the transformer 21 is connected to the connecting point of the semiconductor switches Q1 and Q2, and the other terminal of the primary winding is connected to the connecting point of the semiconductor switches Q3 and Q4.

The semiconductor switches Q1, Q2, Q3, and Q4 convert an input DC power to a high frequency, e.g., radiofrequency, substantially sinusoidal current by a first pair of semiconductor switches Q1 and Q4 and a second pair of semiconductor switches Q2 and Q3, the first and second pairs being turned on and off alternately and repeatedly.

That is, the semiconductor switches Q1, Q2, Q3, and Q4 form the so-called Class-D amplifier circuit and convert the DC power supplied from the variable DC power source unit 10 to a high-frequency power to output and function as a full bridge inverter for outputting the converted high-frequency power into the primary side of the transformer 21.

The diodes D1, D2, D3, and D4 which are connected with the semiconductor switches Q1, Q2, Q3, and Q4 in anti-parallel, are parasite diodes of the semiconductor switches Q1, Q2, Q3, and Q4, respectively.

The transformer 21 comprises a primary winding and a secondary winding which are coupled electromagnetically to each other. An end of the primary winding is connected to the connecting point of the semiconductor switches Q1 and Q2, and the other end is connected to the connecting point of the semiconductor switches Q3 and Q4. The transformer 21 transforms the voltage applied between the both ends of the primary winding according to the turn ratio of the windings to generate a transformed voltage between the both ends of the secondary winding.

In FIG. 1, the load impedance conversion circuit 30 is for making the plasma generating device 2 which is a load, a delayed load with respect to the amplifier circuits 20. An equivalent circuit to the load impedance conversion circuit 30 is shown in FIG. 3.

Figure 3:
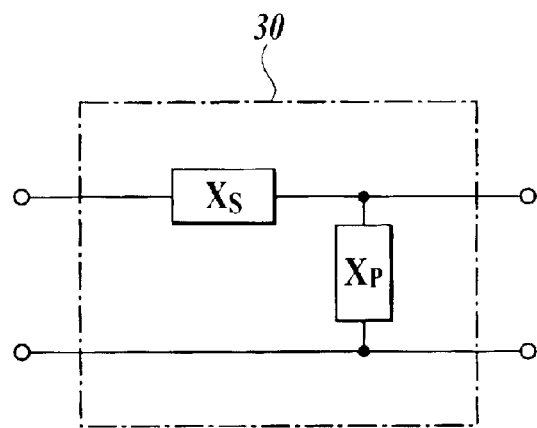
FIG. 3 is a block diagram showing an equivalent circuit of the load impedance conversion circuit.

In FIG. 3, an equivalent circuit to the load impedance conversion circuit 30, which is connected to the latter part of an amplifier circuit 20 is illustrated.

The load impedance conversion circuit 30 can be expressed as the equivalent circuit which comprises a reactance Xs connecting to one of the input terminals in series and a reactance Xp connecting to the input terminals in parallel. Each of the reactance Xs and Xp may be composed of a coil, a capacitor or the like. The reactance Xs and Xp can convert the load impedance of the plasma generating device 2 when seeing it from the side of amplifier circuits 20 into "a delayed load", by selecting the values of reactance Xs and Xp suitably. That is, through the load impedance conversion circuit 30, the load when seeing from the side of amplifier circuits 20 can be deemed as "a delayed load" equivalently.

In FIG. 1, the composition circuit 40 composes the outputs of the plurality of amplifier circuits 20 through the load impedance conversion circuit 30, to generate a high-frequency power with a voltage higher than that of the output of each amplifier circuit 20.

The filter circuit 50 comprises, for example, a coil and a capacitor, to cut off harmonic components which generate a noise, from the output of the composition circuit 40.

The power sensor 60 detects the output power of the filter circuit 50 and outputs the detected value to the control circuit 70.

The control circuit 70 performs the so-called feedback control, that is, controlling the power conversion operation of the variable DC power source unit 10 on the basis of the detected value of the power sensor 60.

Next, the operation of the power supply apparatus according to the embodiment of the invention will be explained. The explanation will be performed with reference to FIG. 4 which shows the power supply apparatus 1 for generating a plasma schematically in order to make the explanation simple and comprehensive.

Figure 4:
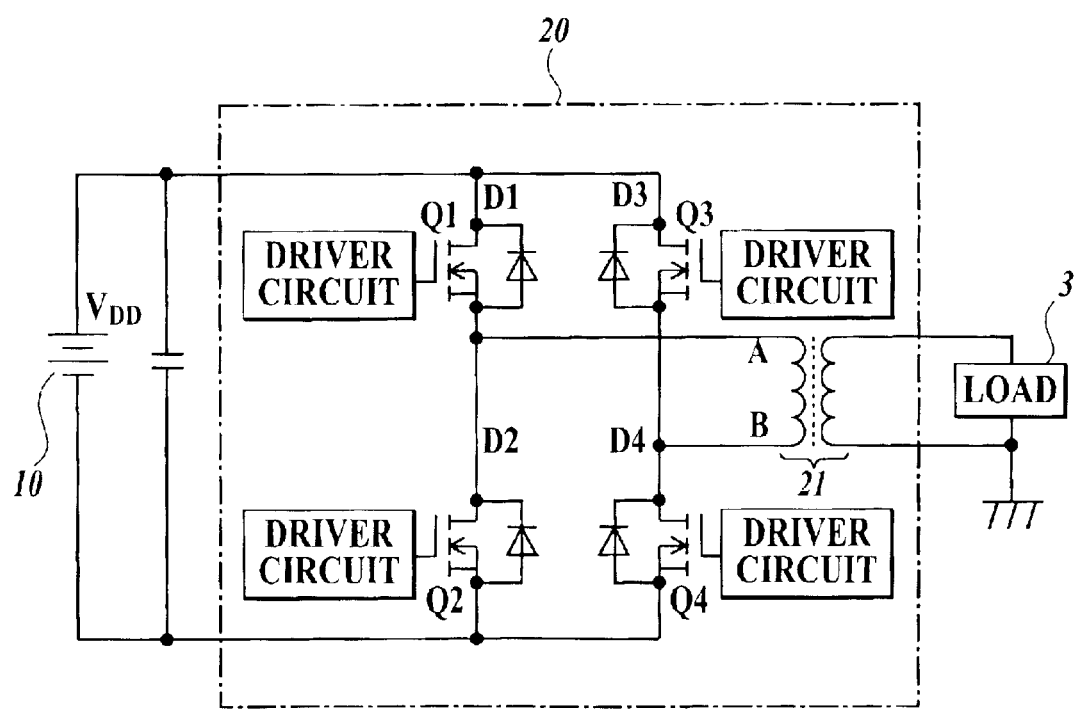
FIG. 4 is a block diagram showing an equivalent circuit of the power supply apparatus for generating a plasma, shown in FIG. 1.

In FIG. 4 which shows the power supply apparatus 1, a plurality of amplifier circuits are omitted and only one amplifier circuit 20 is drawn, and the composition circuit 40, the filter circuit 50 and the power sensor 60 are also omitted. Further, a constant voltage of DC power source $V_{DD}$ is indicated in place of the variable DC power source unit 10, and a load 3 which was converted into "a delayed load" through the load impedance conversion circuit 30, in place of the plasma generating device 2 when seeing from the side of amplifier circuits 20.

FIGS. 5A–5C are timing charts showing the operation of the amplifier circuit 20 shown in FIG. 4. FIG. 5A shows ON and OFF state of the semiconductor switches Q1 and Q4, and FIG. 5B shows ON and OFF state of the semiconductor switches Q2 and Q3, and FIG. 5C shows the current which flows to the primary of the transformer 21. The abscissa axis indicates time t in common. The time intervals I–IV correspond to an operational period of the amplifier circuit 20.

In FIG. 5C, the upper part with respect to the central lateral line shows the current flowing from "A" to "B" in the primary of the transformer 21, (in the downward direction in FIG. 4) which may be referred to "A to B direction" hereinafter, and the lower part with respect to the central lateral line shows the current flowing from "B" to "A", (in the downward direction in FIG. 4) which may be referred to "B to A direction" hereinafter.

In FIG. 5C, the solid line indicates the current flowing into the amplifier circuit 20, and the broken line indicates the current flowing into the amplifier circuit 20 when no load impedance conversion circuit 30 is provided, that is, when the load 3 seen from (with respect to) the amplifier circuits 20 is a load of only resistance. That is, because the load 3 seen from the amplifier circuits 20 is "a delayed load", the phase of the current which flows to the primary of the transformer 21 is delayed to the ON/OFF state of the semiconductor switches Q1, Q2, Q3 and Q4.

The delayed phase of current depends on the circuit constant of the load impedance conversion circuit 30, i.e., values of the reactance Xs and Xp. The value thereof is determined so that the direction of the current is changed after an elapse of a predetermined time since the semiconductor switches turn on, in particular, time corresponding to the recovery time for diodes, as described later.

Interval I:

In FIGS. 5A and 5B, each of the semiconductor switches Q1, Q2, Q3 and Q4 is OFF in the interval I. During the interval, the current in the primary of the transformer flows in B to A direction, and the diodes D1 and D4 are ON as shown in FIG. 6.

Interval II:

In the interval II, although the semiconductor switches Q1 and Q4 are turned ON, the current flowing in the primary of the transformer 21 is delayed to change the direction because the load 3 seen from the amplifier circuits 20 is "a delayed load".

Figure 7:
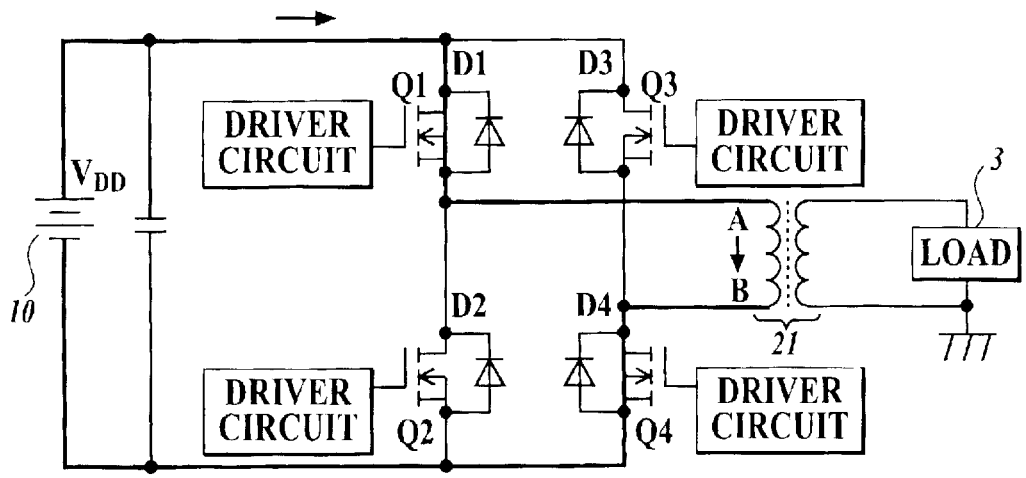
FIG. 7 is a circuit diagram showing an example of current path in an amplifier.

During beginning of the interval II, the current continues to flow in B to A direction, with maintaining the state just before, like the state shown in FIG. 6, and the diodes D1 and D4 are ON. Thereafter, although the flowing direction of current is changed, because the semiconductor switches Q1 and Q4 are ON, the current in the primary of the transformer flows in A to B direction, as shown in FIG. 7.

As described above, because the load 3 is "a delayed load" with respect to the amplifier circuits 20, the flowing direction of current is delayed after the semiconductor switches Q1 and Q4 are turned ON, and then the direction thereof is changed. Thus, since the state of the amplifier circuits 20 is transferred from the diodes D1 and D4 being ON to the semiconductor switches Q1 and Q4 being ON. As a result, no excess current nor excess voltage are generated in the semiconductor switches Q2 and Q3 and in the diodes D2 and D3.

Figure 8:
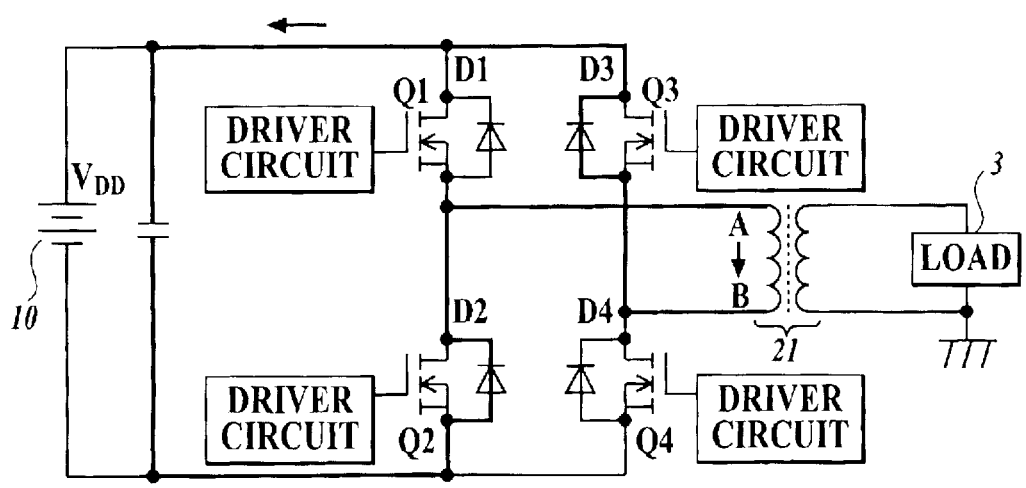
FIG. 8 is a circuit diagram showing an example of current path in an amplifier.

Interval III:

In the subsequent interval III, when the semiconductor switches Q1 and Q4 are turned OFF, the current continues to flow in A to B direction, with maintaining the state just before, as shown in FIG. 8, and the diodes D2 and D3 are ON.

Interval IV:

In the interval IV, although the semiconductor switches Q2 and Q3 are turned ON, the current flowing in the primary of the transformer 21 is delayed to change the direction because the load 3 is "a delayed load" with respect to the amplifier circuits 20.

Figure 9:
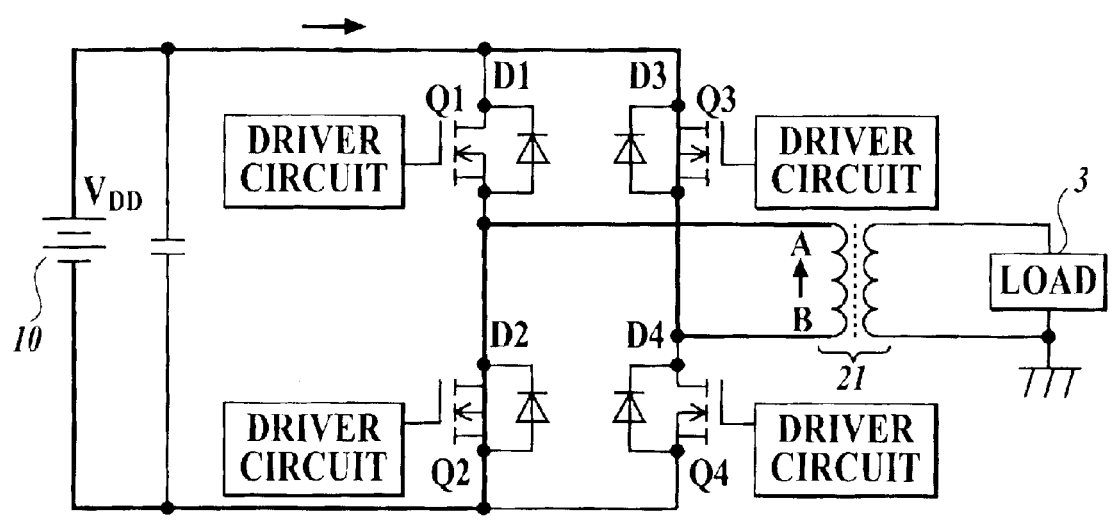
FIG. 9 is a circuit diagram showing an example of current path in an amplifier.

During beginning of the interval IV, the current continues to flow in A to B direction, with maintaining the state just before, like the state shown in FIG. 8, and the diodes D2 and D3 are ON. Thereafter, although the flowing direction of current is changed, because the semiconductor switches Q2 and Q3 are ON, the current in the primary of the transformer flows in B to A direction, as shown in FIG. 9.

As described above, because the load 3 seen from the amplifier circuits 20 is "a delayed load", the flowing direction of current is delayed after the semiconductor switches Q2 and Q3 are turned ON, and then the direction thereof is changed. Thus, since the state of the amplifier circuits 20 is transferred from the diodes D2 and D3 being ON to the semiconductor switches Q2 and Q3 being ON. As a result, no excess current nor excess voltage are generated in the semiconductor switches Q1 and Q4 and in the diodes D1 and D4.

When the semiconductor switches Q2 and Q3 are turned OFF at the end of the interval IV, an operational period of amplifier circuits 20 is completed. Thereafter, similar operations are repeated from the interval I to the interval IV.

As described above, the semiconductor switches Q1, Q2, Q3, and Q4 which form the amplifier circuit 20 function as a full bridge inverter and also form an amplifier circuit of Class-D. As a result, no excess current nor excess voltage are generated in the semiconductor switches Q1, Q2, Q3, and Q4, and therefore a voltage not more than DC power source $V_{DD}$ is applied between the source and the drain of each semiconductor switch. Therefore, even if transient steep fluctuations in load peculiar to a plasma generating apparatus are generated, no excess voltage is generated in the semiconductor switches Q1, Q2, Q3, and Q4. Accordingly, it is possible to prevent destruction of these semiconductor switches.

Converting load 3 seen from the amplifier circuit 20, into "a delayed load" through the load impedance conversion circuit 30, that is, making the phase of current into a delayed phase, enables reduction of the switching loss of the circuit and realization of high efficiency.

The amplifier circuit 20 can be operated in a desired frequency because it does not have any element which is dependent on operational frequency. That is, the amplifier circuit 20 can be operated in a desired frequency by changing the driving signal, i.e., gate signal, of the semiconductor switches Q1, Q2, Q3, and Q4. Therefore, in order to carry out operation thereof in a different frequency for whole power supply apparatus 1 for plasma, only changing the circuit constants of the load impedance conversion circuit 30 and the filter circuit 50 is required, without changing other circuit elements.

Next, the operation of power supply apparatus 1 for plasma will be explained, in case that load 3 seen from the amplifier circuit 20 were a leading load.

FIGS. 10A–10C are timing charts showing the operation of the amplifier circuit 20 in case of load 3 being a "leading load". FIG. 10A shows ON and OFF state of the semiconductor switches Q1 and Q4, and FIG. 10B shows ON and OFF state of the semiconductor switches Q2 and Q3, and FIG. 10C shows the current I which flows through the primary of the transformer 21. The abscissa axis indicates time t in common. The time intervals I–IV correspond to an operational period of the amplifier circuit 20, like the case of FIGS. 5A–5C.

In FIG. 10C, the broken line indicates the current when no load impedance conversion circuit 30 is provided, like the case of FIG. 5C. That is, because the load 3 is "a leading load" with respect to the amplifier circuits 20, the phase of the current which flows to the primary of the transformer 21 leads to the ON/OFF state of the semiconductor switches Q1, Q2, Q3 and Q4.

Interval I:

In FIGS. 10A and 10B, each of the semiconductor switches Q1, Q2, Q3 and Q4 is OFF in the interval I. During the interval, the current in the primary of the transformer flows in A to B direction, and the diodes D2 and D3 are ON, as shown in FIG. 11.

Figure 12:
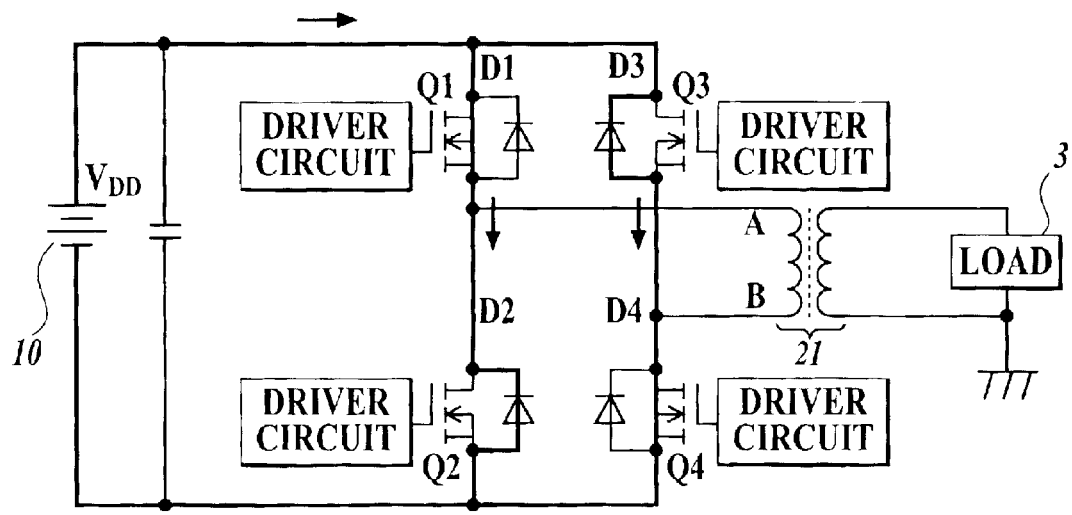
FIG. 12 is a circuit diagram showing an example of current path in an amplifier.

Interval II:

In the interval II, although the semiconductor switches Q1 and Q4 are turned ON, the diodes D2 and D3 are not turned OFF immediately just after the semiconductor switches were turned ON because of the recovery (reverse recovery) characteristics thereof. Consequently, the semiconductor switch Q1 and the diodes D3 are short-circuited with the diodes D2 and the semiconductor switch Q4, respectively, to result in losses because of short-circuit current flow through them, as shown in FIG. 12.

Figure 13:
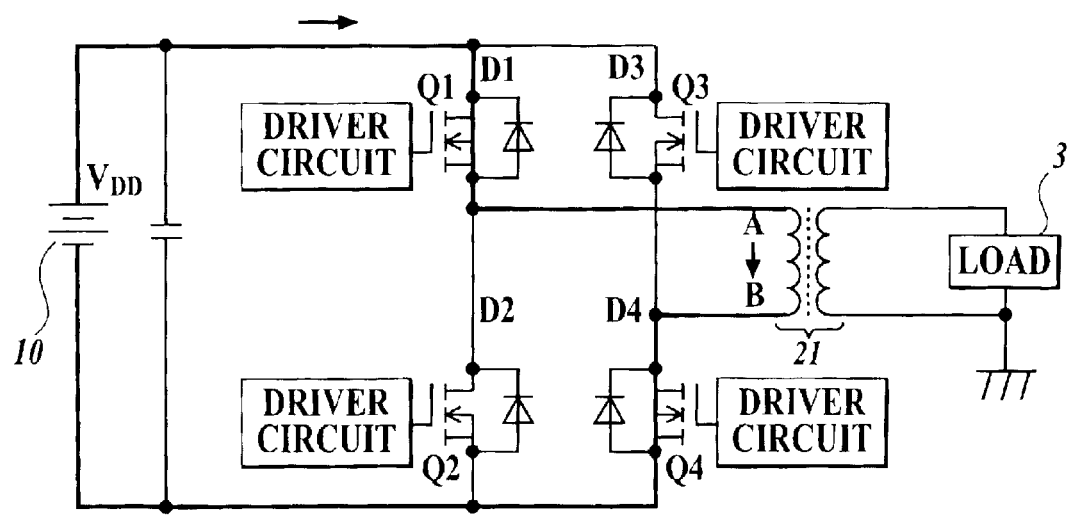
FIG. 13 is a circuit diagram showing an example of current path in an amplifier.

When a period of time corresponding to the recovery (reverse recovery) time of the diodes D2 and D3 has elapsed, these diodes are turned OFF, so that the current flows in A to B direction, and the semiconductor switches Q1 and Q4 are ON, as shown in FIG. 13.

In the end of interval II, because the load 3 is "a leading load" with respect to the amplifier circuits 20, the flowing direction of current is turned B to A direction, and the semiconductor switches Q1 and Q4 are ON, and the diodes D1 and D4 are also ON.

Figure 14:
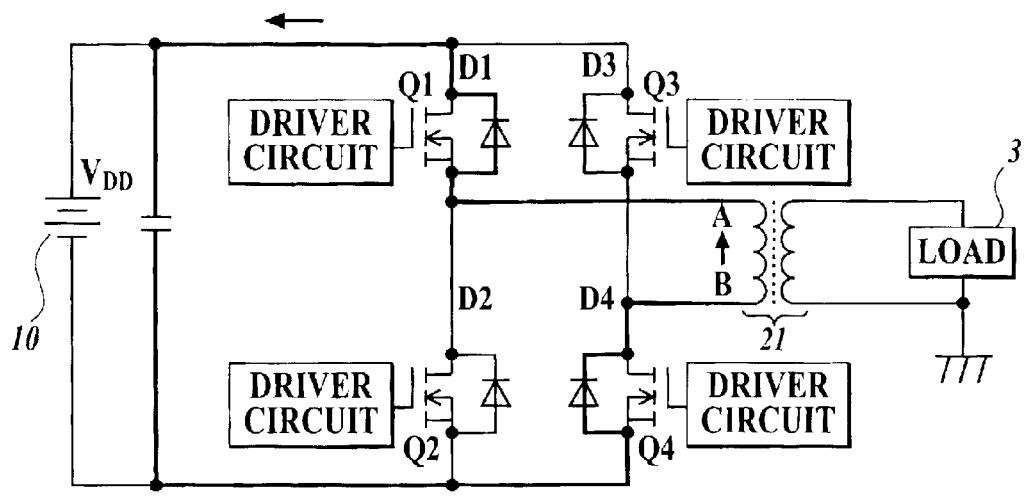
FIG. 14 is a circuit diagram showing an example of current path in an amplifier.

Interval III:

In the subsequent interval III, when the semiconductor switches Q1 and Q4 are turned OFF, the current continues to flow in B to A direction, with maintaining the state just before, as shown in FIG. 14, and the diodes D1 and D4 are ON.

Figure 15:
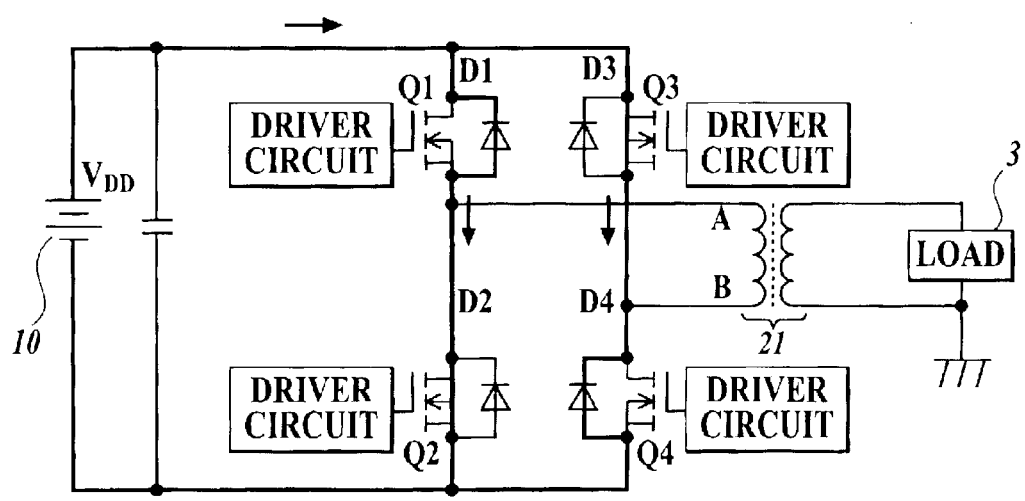
FIG. 15 is a circuit diagram showing an example of current path in an amplifier.

Interval IV:

In the interval IV, although the semiconductor switches Q2 and Q3 are turned ON, the diodes D1 and D4 are not turned OFF immediately just after the semiconductor switches were turned ON because of the recovery characteristics thereof. Consequently, the diodes D1 and the semiconductor switch Q3 are short-circuited with the semiconductor switch Q2 and the diodes D4, respectively, to result in losses because of short-circuit current flow through them, as shown in FIG. 15.

Figure 16:
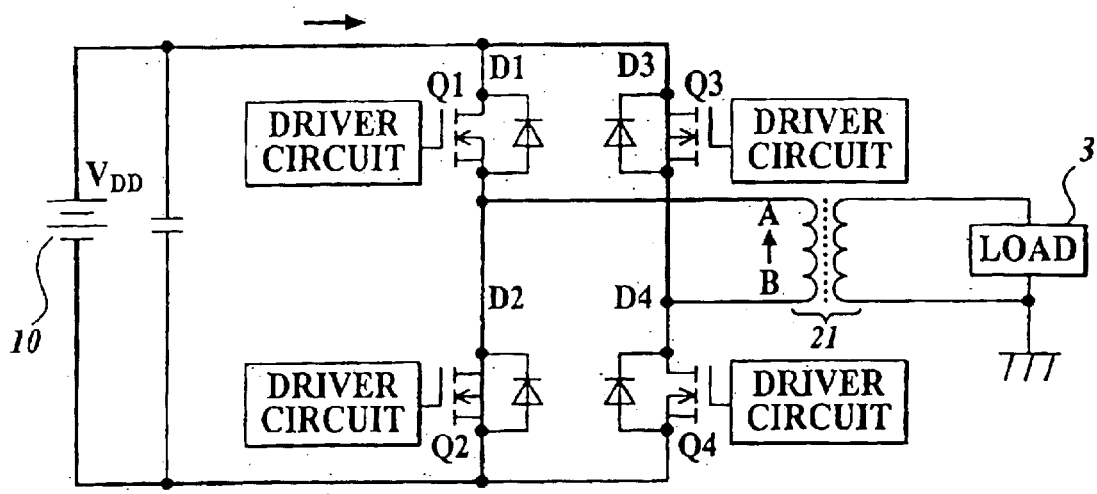
FIG. 16 is a circuit diagram showing an example of current path in an amplifier.
Figure 17:
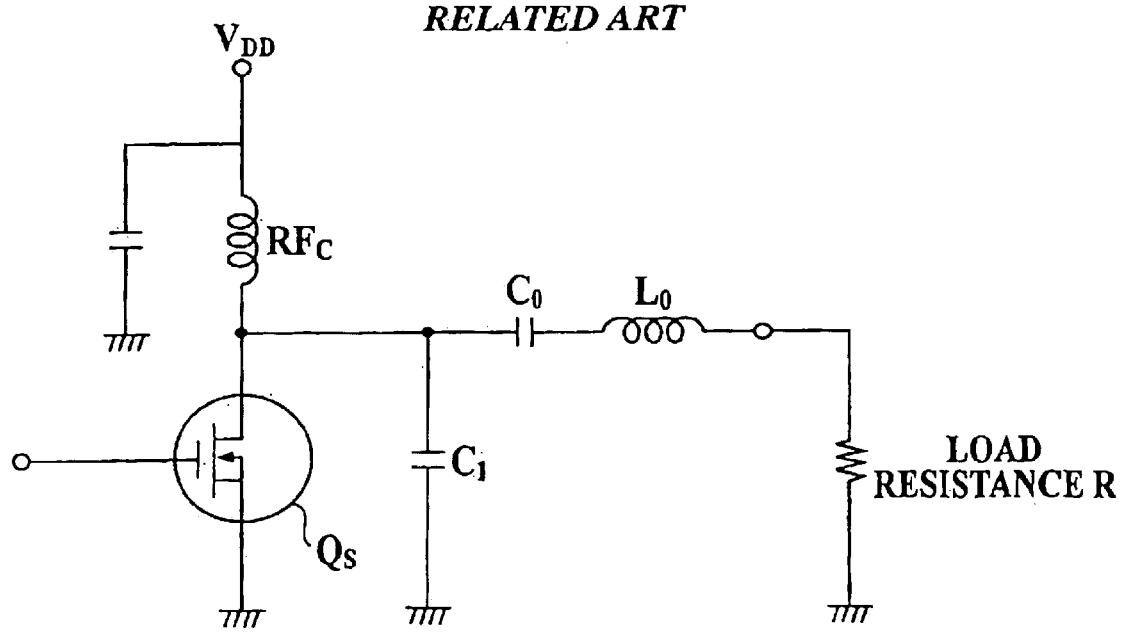
FIG. 17 is a circuit diagram showing a fundamental construction of an amplifier of Class-E.

When a period of time corresponding to the recovery time of the diodes D1 and D4 has elapsed, these diodes are turned OFF, so that the current flows in B to A direction, and the semiconductor switches Q2 and Q3 are ON, as shown in FIG. 16.

In the end of interval IV, because the load 3 is "a leading load" with respect to the amplifier circuits 20, the flowing direction of current is turned A to B direction, and the semiconductor switches Q2 and Q3 are ON, and the diodes D2 and D3 are also ON.

When the semiconductor switches Q2 and Q3 are turned OFF, an operational period of amplifier circuits 20 is completed. Thereafter, similar operations are repeated from the interval I to the interval IV.

As described above, in case that the phase of current into a leading phase, the parasite diodes are not turned OFF immediately when the switching elements were turned ON because of the recovery characteristics thereof. As a result, each of the parasite diodes is short-circuited with the semiconductor switch which is connected with the parasite diode in series, every ON/OFF of the switching elements, to result in increased losses of the circuit. That is, the losses are depending on the switching frequency of the circuit. In particular, the losses are increased very much in a radio frequency power supply apparatus such as a power supply apparatus for generating a plasma.

Even when the load 3 has the same phase, that is, even when no load impedance conversion circuit 30 is provided, and the load 3 is a plasma generating device 2a which is a load of only resistance, it brings about similar results. For example, in the interval II, when the semiconductor switches Q1 and Q4 are turned ON, the current flows in A to B direction, as shown by the broken line in FIG. 10C. Accordingly, a short-circuit current caused by the recovery characteristics of the diodes D2 and D3 flows, like the case of FIG. 12, to result in losses occurred in the circuit.

On the contrary, when the load 3 is "a delayed load" with respect to the amplifier circuits 20, that is, when the phase of the current is delayed, as described above, for example, in the interval II, when the semiconductor switches Q1 and Q4 are turned ON, the current flows in B to A direction, as shown in FIG. 5C. That is, the circuit is smoothly transferred from the ON state of the diodes D1 and D4 to the ON state of the semiconductor switches Q1 and Q4, no short-circuit current flow. Accordingly, it is possible to reduce losses caused by ON/OFF of the switching elements, and to realize a high efficiency.

According to the present invention, it is possible to realize a power supply apparatus for generating a plasma which has a high efficiency and can protect the switching element from steep transient fluctuations of plasma load.

The entire disclosure of Japanese Patent Application No. Tokugan hei-11-368199 filed on Dec. 24, 1999 including specification, claims, drawings and summary are incorporated herein by reference in its entirety.

What is claimed is:

1. A power supply apparatus for generating a plasma for supplying a high-frequency power to a plasma generating device which is a load, comprising:

a DC power supply;

a power conversion circuit which includes a plurality of amplifier circuits of Class-D, each amplifier circuit including a plurality of switching elements and which converts a DC power output of the DC power supply to a high-frequency power to output; and a load impedance conversion circuit which converts a load impedance to a predetermined delayed load, wherein the power supply apparatus is configured to supply the high-frequency power output from the power conversion circuit to the plasma generating device through the load impedance conversion circuit.

2. The power supply apparatus for generating a plasma as claimed in claim 1, wherein the power conversion circuit comprises a full bridge inverter circuit in which a plurality of switching elements are bridge-connected.

3. The power supply apparatus for generating a plasma as claimed in claim 1, wherein the predetermined delayed load makes a phase of load current delay so that a direction of a load current is reversed after an elapse of a predetermined time since one of the switching elements turns on.

4. The power supply apparatus for generating a plasma as claimed in claim 3, wherein the predetermined time is longer than a time corresponding to a recovery time for parasite diodes of one of the switching elements.

5. The power supply apparatus for generating a plasma as claimed in claim 3, wherein the load impedance conversion circuit comprises a reactance Xs connected to one of input terminals thereof in series and a reactance Xp connected to the input terminals in parallel, each of the reactance Xs and Xp comprising a coil or a capacitor, to determine the phase of load current delayed.

6. The power supply apparatus for generating a plasma as claimed in claim 1, further comprising: a composition circuit for composing outputs of the plurality of amplifier circuits which are supplied through the load impedance conversion circuit, to generate a high-frequency power with a high voltage; a filter circuit for cutting off harmonic components from an output of the composition circuit; a power sensor for detecting an output power of the filter circuit; and a control circuit for controlling a power conversion operation of the DC power supply on the basis of a detected value of the power sensor.

7. The power supply apparatus for generating a plasma as claimed in claim 1, wherein each of the amplifier circuits of Class-D comprises: first, second, third and fourth semiconductor switches which are bridge-connected; and a transformer, a terminal of a primary winding of the transformer being connected to a connecting point of the first and second semiconductor switches and the other terminal of the primary winding being connected to a connecting point of the third and fourth semiconductor switches.

8. The power supply apparatus for generating a plasma as claimed in claim 7, wherein the first, second, third and fourth semiconductor switches have first, second, third and fourth parasite diodes, respectively; and the predetermined delayed load allows the amplifier circuit to transfer from the first and fourth parasite diodes being ON to the first and fourth semiconductor switches being ON, so that no excess current nor excess voltage is generated in the second and third semiconductor switches and in the second and third parasite diodes, and to transfer from the second and third parasite diodes being ON to the second and third semiconductor switches being ON, so that no excess current nor excess voltage is generated in the first and fourth semiconductor switches and in the first and fourth parasite diodes.

* * * * *